(12) United States Patent
Im

(10) Patent No.: US 7,601,582 B2
(45) Date of Patent: Oct. 13, 2009

(54) METHOD FOR MANUFACTURING A SEMICONDUCTOR DEVICE HAVING A DEVICE ISOLATION TRENCH

(75) Inventor: Song Hyeuk Im, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 113 days.

(21) Appl. No.: 11/529,354

(22) Filed: Sep. 29, 2006

(65) Prior Publication Data

US 2007/0264789 A1 Nov. 15, 2007

(30) Foreign Application Priority Data

May 10, 2006 (KR) .................. 10-2006-0041996

(51) Int. Cl.
*H01L 21/8238* (2006.01)
(52) U.S. Cl. ............... 438/226; 438/270; 438/424; 257/E21.545; 257/E21.561
(58) Field of Classification Search ........ 438/245, 438/311, 424, 479, 481, 142, 151, 226, 270; 257/347, E27.112, E21.545, E21.561
See application file for complete search history.

(56) References Cited

U.S. PATENT DOCUMENTS

| 6,194,289 | B1 | 2/2001 | Lee | 438/450 |
| 6,660,596 | B2 * | 12/2003 | Adkisson et al. | 438/286 |
| 7,217,623 | B2 * | 5/2007 | Kim et al. | 438/283 |
| 2002/0137271 | A1 * | 9/2002 | Forbes et al. | 438/201 |
| 2005/0227435 | A1 * | 10/2005 | Oh et al. | 438/257 |
| 2007/0173005 | A1 * | 7/2007 | Lee | 438/197 |

FOREIGN PATENT DOCUMENTS

KR 1020000027402 A 5/2000

* cited by examiner

*Primary Examiner*—Khiem D Nguyen
(74) *Attorney, Agent, or Firm*—Townsend and Townsend and Crew LLP

(57) ABSTRACT

A method for manufacturing a semiconductor device includes forming a semiconductor substrate to have a SOI structure by an epitaxial process for forming a gate while forming an insulating film pattern in a bottom where a device isolation trench is formed. The method thereby increases the process margin for forming a device isolation film and prevents the punch-through phenomenon to improve electrical characteristics of semiconductor devices and increase product yield.

16 Claims, 8 Drawing Sheets

METHOD FOR MANUFACTURING A SEMICONDUCTOR DEVICE HAVING A DEVICE ISOLATION TRENCH

BACKGROUND OF THE INVENTION

The present invention generally relates to a method for manufacturing a semiconductor device, and more specifically, to a method of forming a semiconductor substrate with a SOI structure for forming a gate by an epitaxial process while forming an insulating film pattern in a bottom where a device isolation trench is formed. The invention thereby improves the electrical characteristics of the semiconductor device and increases product yield.

FIGS. 1a through 1e are cross-sectional diagrams illustrating a known method for manufacturing a semiconductor device.

After a pad oxide film 30 and a pad nitride film 40 are formed over a semiconductor substrate 10, the pad nitride film 40, the pad oxide film 30 and the semiconductor substrate 10 are etched with a device isolation mask (not shown) to form a device isolation trench 50.

A device isolation oxide film layer 60 for filling the trench 50 is formed. As design rules of the semiconductor device have been reduced, the aspect ratio of the trench 50 is relatively increased so that the process for filling an oxide film layer 60 becomes complex. As a result, the process margin is dramatically reduced, and a void is generated in the oxide film layer 60.

The pad nitride film 40 and the pad oxide film 30 are removed, and the device isolation oxide film layer 60 is planarized to form a device isolation film for defining an active region. Then, a hard mask layer is formed over the semiconductor substrate 10. A photoresist pattern 75 for defining a recess gate portion is formed over the hard mask layer. The hard mask layer is etched with the photoresist pattern 75 as an etching mask to form a hard mask pattern 70 which exposes the recess gate portion.

The semiconductor substrate 10 is etched at a predetermined thickness with the hard mask pattern 70 as an etching mask to form a recess 80. Then, a channel-impurity-ion-implanting process is performed on the active region 20.

A gate 90 is formed over the semiconductor substrate 10. Then, impurities are implanted into a region between the gates to form source/drain regions 85.

As the length of gate channels becomes shorter, the concentration of impurities implanted into the channel is required to be higher in order to prevent a punch-through phenomenon and degradation of refresh characteristics. However, when the concentration of impurities is increased, the electric field of the semiconductor substrate increases, and electrons are moved in a voltage less than a threshold voltage. The movement of electrons increases the drain voltage, and causes an interaction with the source region to lower the potential barrier of the source region and increase leakage current. Here, the gate voltage cannot control the drain voltage so that electrons between the source/drain regions are driven to the drain, which is called the punch-through phenomenon.

SUMMARY OF THE INVENTION

Various embodiments are directed at providing a method for manufacturing a semiconductor device that includes forming a semiconductor substrate to have a SOI structure by an epitaxial process for forming a gate while forming an insulating film pattern in a bottom where a device isolation trench is formed, thereby increasing the process margin for forming a device isolation film and preventing the punch-through phenomenon.

According to an embodiment of the present invention, a method for manufacturing a semiconductor device to form a SOI (Silicon On Insulator) for forming a recess gate includes:

forming an insulating film pattern over a bottom silicon substrate of the SOI semiconductor substrate by overlapping the insulating film pattern with both edges of an active region in a length direction;

forming an epitaxial layer over the bottom silicon substrate;

forming a hard mask pattern which exposes a device isolation trench and a recess gate portion over the epitaxial layer;

etching the epitaxial layer with the hard mask pattern as an etching mask to form a device isolation trench and a recess;

forming an oxide film layer for filling the trench and the recess;

removing the hard mask pattern to perform an ion-implanting process on the active region;

removing the oxide film layer filled in the recess; and forming a gate over the recess.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings.

Figure 1A:
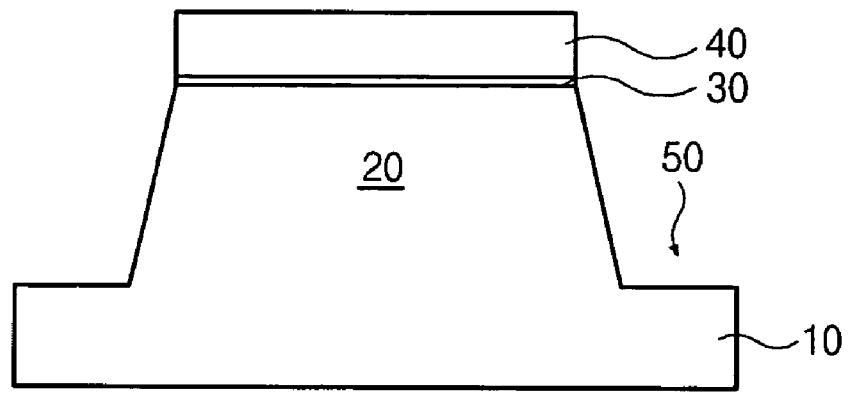
FIGS. 1a through 1e are cross-sectional diagrams illustrating a known method for manufacturing a semiconductor device.
Figure 1B:
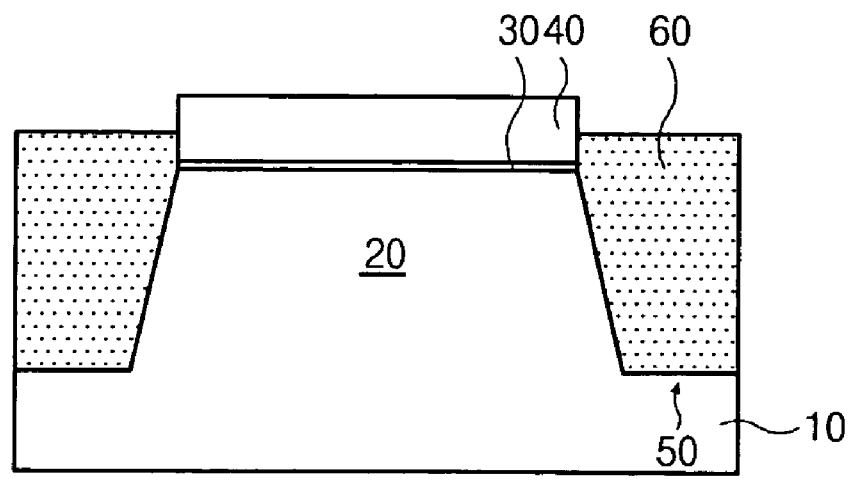
Figure 1C:
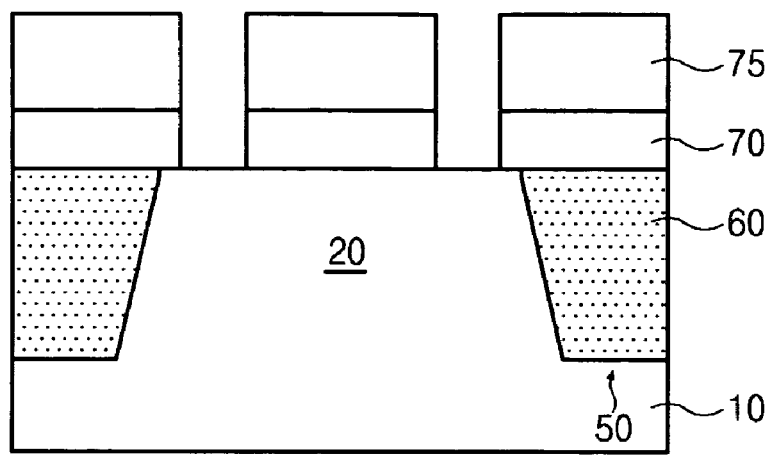
Figure 1D:
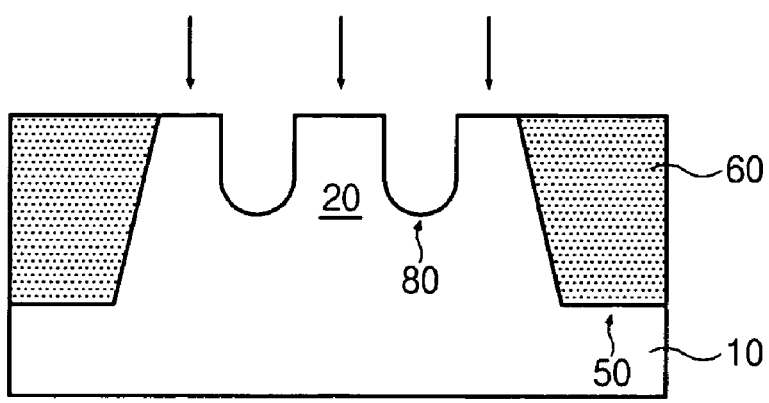
Figure 1E:
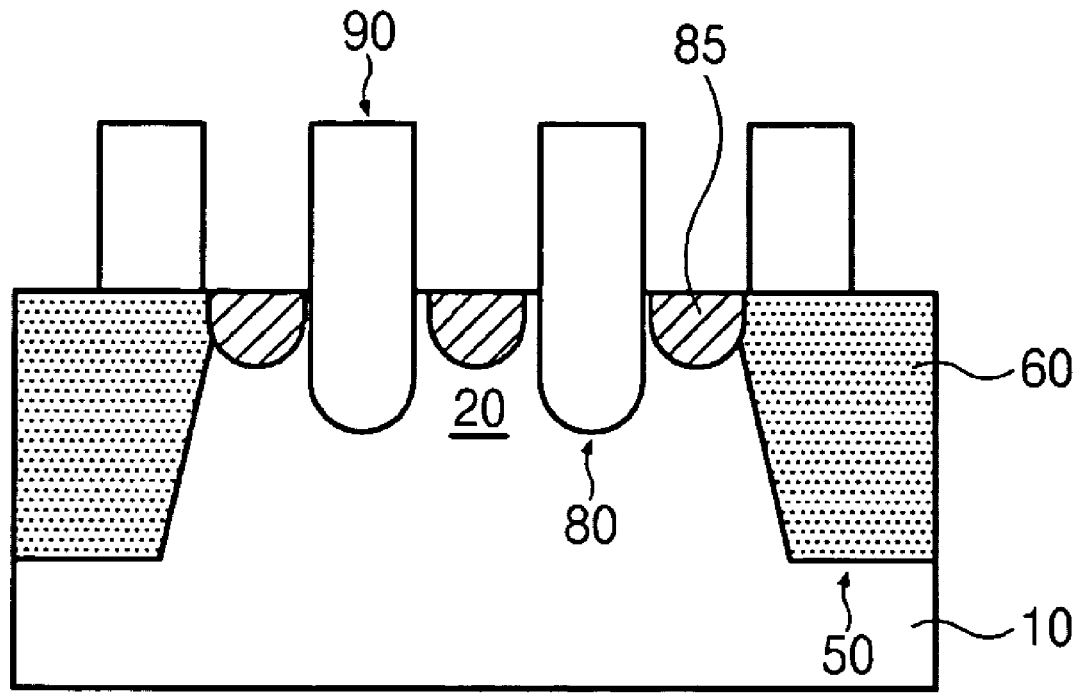
Figure 2:
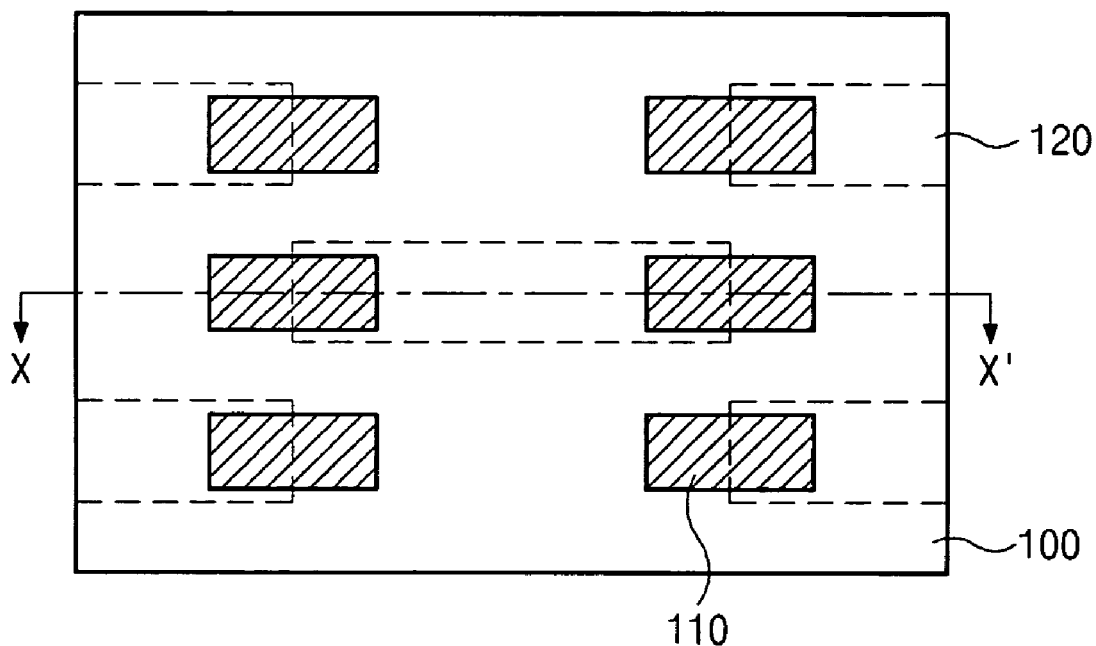
FIG. 2 is a plane diagram illustrating a method for manufacturing a semiconductor device according to an embodiment of the present invention.

FIG. 2 is a plane diagram illustrating a method for manufacturing a semiconductor device according to an embodiment of the present invention.

An insulating film pattern 110 is formed in a predetermined portion over a bottom silicon substrate 100 used as a bottom substrate of a semiconductor substrate for SOI. The insulating film pattern 110 is formed in a rectangular shape that is overlapped in both edges in a length direction of an active region 120 having a bar shape formed in a subsequent process.

Figure 3:
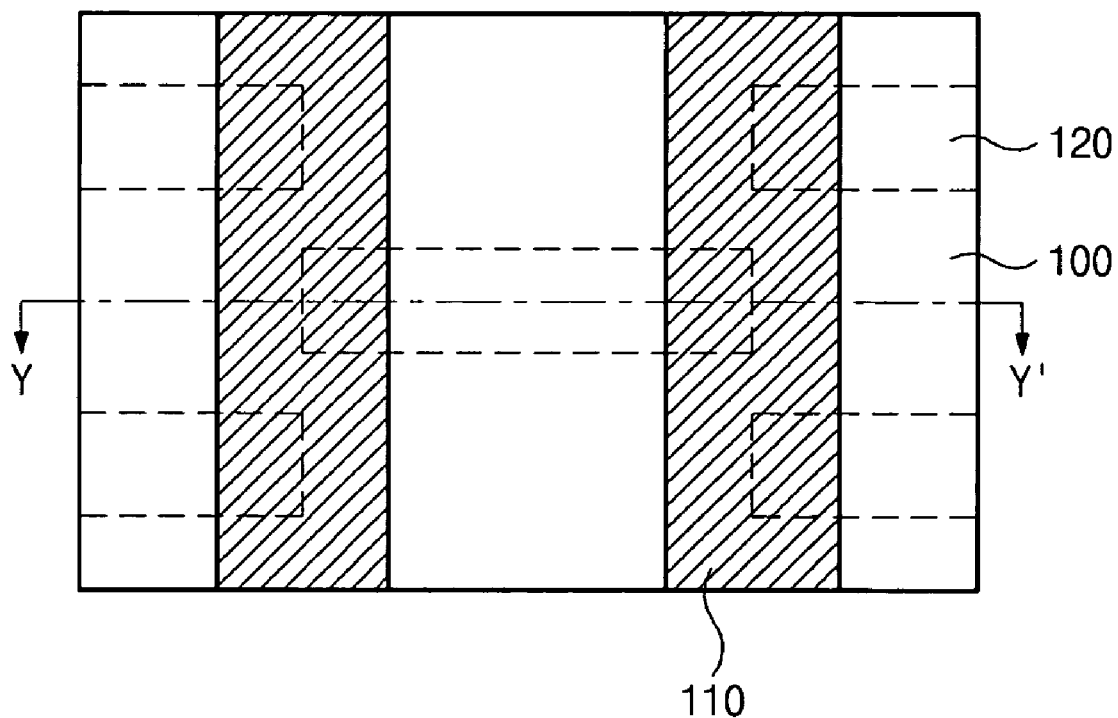
FIG. 3 is a plane diagram illustrating a method for manufacturing a semiconductor device according to an embodiment of the present invention.
Figure 4A:
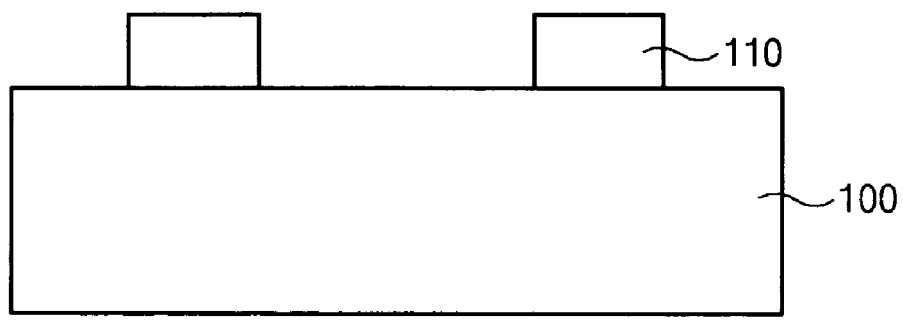
FIGS. 4a through 4f are cross-sectional diagrams illustrating a method for manufacturing a semiconductor device according to an embodiment of the present invention.
Figure 4B:
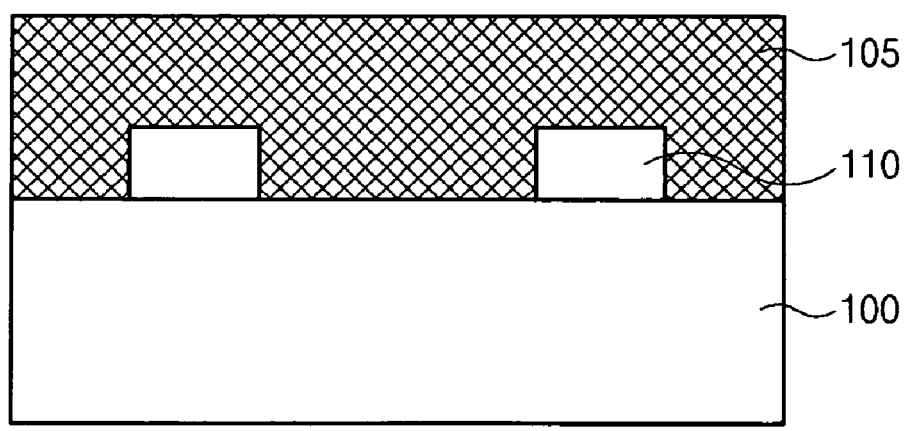
Figure 4C:
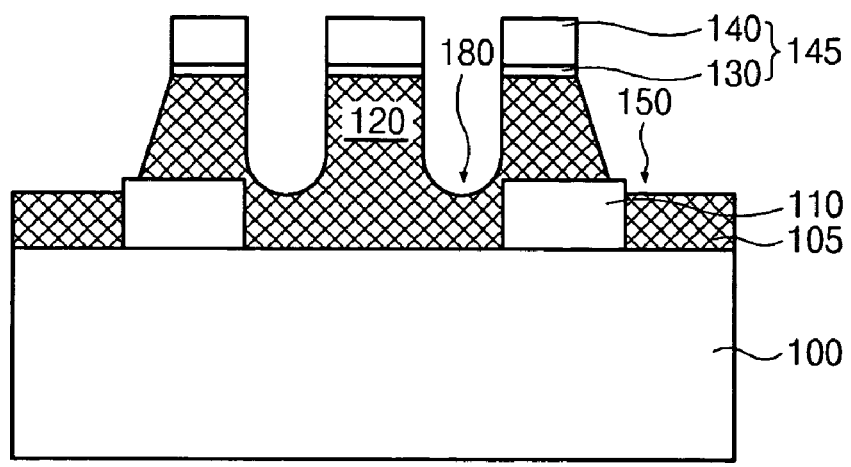
Figure 4D:
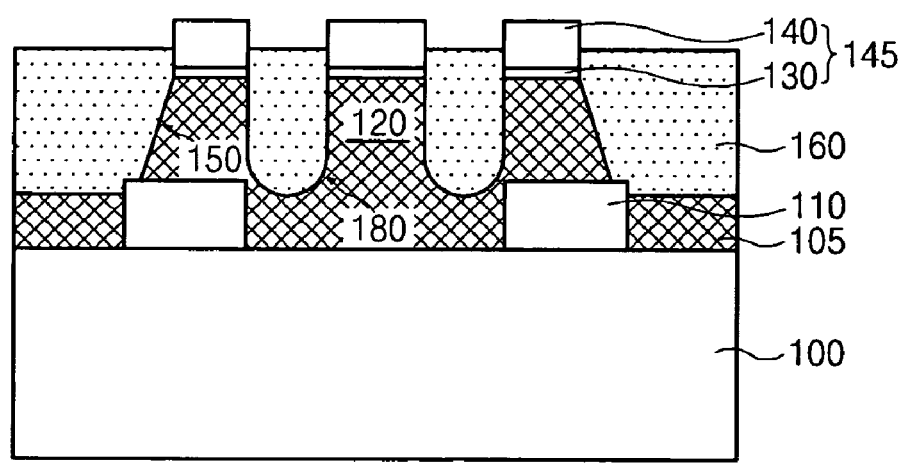
Figure 4E:
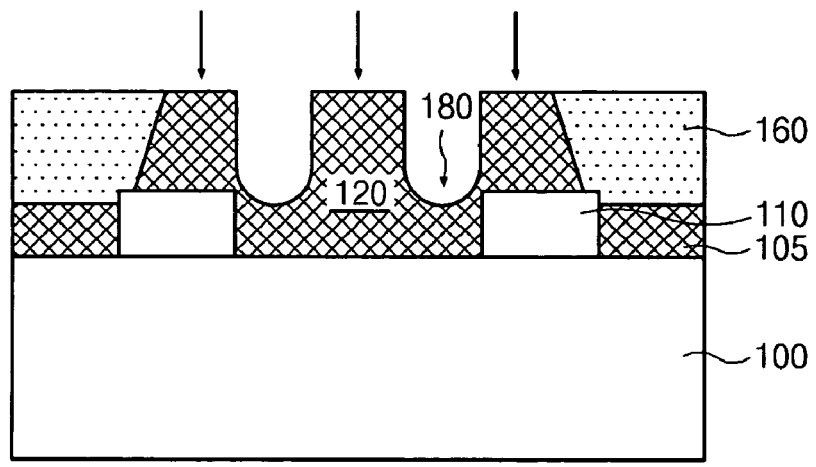
Figure 4F:
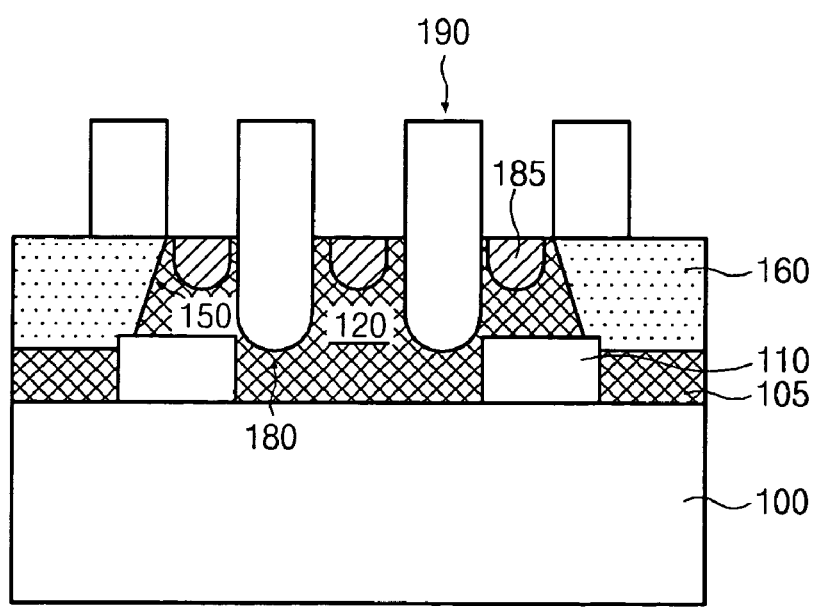

FIG. 3 is a plane diagram illustrating a method for manufacturing a semiconductor device according to an embodiment of the present invention.

The insulating film pattern 110 is formed in a predetermined portion of the bottom silicon substrate 100 used as a bottom substrate of the semiconductor substrate for SOI. The insulating film pattern 110 is formed in a line shape that is overlapped in both edges in a length direction of an active region 120 having a bar shape formed in a subsequent process.

FIGS. 4a through 4f are cross-sectional diagrams illustrating a method for manufacturing a semiconductor device according to an embodiment of the present invention, which show a cross-section of XX' of FIG. 2 or YY' of FIG. 3.

The insulating film pattern 110 is formed in a predetermined portion of the bottom silicon substrate 100 used as a bottom substrate of the semiconductor substrate for SOI. The insulating film pattern 110 is formed to overlap in both edges in a length direction of an active region 120 having a bar shape formed in a subsequent process.

Preferably, the insulating film pattern 110 is formed in a rectangular or line shape to overlap in both edges in a length direction of an active region 120 having a bar shape formed in a subsequent process. The insulating film pattern is formed to have a thickness ranging from 300 to 500 Å. The bottom of the recess formed in a subsequent process is formed to separate at a thickness ranging from 100 Å to 200 Å from the insulating film pattern 110 so as to determine a line-width.

An epitaxial layer 105 is formed over the bottom silicon 100 substrate to obtain a SOI semiconductor substrate. The epitaxial layer 105 is formed to have a thickness ranging from 2000 Å to 3000 Å.

Then, a pad oxide film 130 and a pad nitride film 140 for hard mask are sequentially formed over the epitaxial layer 105. The pad nitride film 140 and the pad oxide film 130 are partially etched to form a hard mask pattern 145 which exposes a device isolation portion and a recess gate portion.

Next, the epitaxial layer 105 is etched with the hard mask pattern 145 as an etching mask to form a device isolation trench 150 and a recess 180. The device isolation trench 150 and the recess 180 are etched to have a depth ranging from 1500 Å to 2500 Å so as to expose a predetermined portion of the insulating film pattern 110 by the device isolation trench 150. The bottom of the recess formed in a subsequent process is formed to be separated at a thickness ranging from 100 Å to 200 Å from the insulating film pattern 110. The active region 120 is defined by the device isolation trench 150.

Thereafter, an oxide film layer 160 for filling the trench 150 and the recess 180 is formed. After the oxide film layer 160 is formed, a CMP process is performed until the thickness of the pad nitride film of the hard mask pattern remains ½ thereof so as to separate the oxide film layer 160 and form a device isolation film that defines the active region 120.

The hard mask pattern 145 is removed, and a channel-ion-implanting process is performed in the active region 120. The removing-the-hard-mask-pattern process includes removing the pad nitride film 140 with hot $H_3PO_4$.

The oxide film layer 160 filled in the recess 180 is removed, and a gate 190 is formed over the recess 180. Then, impurities are implanted into a region between gates to form source/drain regions 185. The removing-the-oxide-film-layer 160 process is performed by a wet-etching process with a mask to expose the recess gate portion.

As described above, according to an embodiment of the present invention, a method for manufacturing a semiconductor device includes forming a semiconductor substrate to have a SOI structure by an epitaxial process for forming a gate while forming an insulating film pattern in a bottom where a device isolation trench is formed, thereby preventing the punch-through phenomenon, reducing leakage current, improving refresh characteristics and the process margin for forming a device isolation film to improve electric characteristics of semiconductor devices and increase product yield.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:

patterning a deposited insulating film on a bottom silicon substrate of a SOI (Silicon On Insulator) semiconductor substrate to form an insulating film pattern;

forming an epitaxial layer on the bottom silicon substrate and the insulating film pattern;

forming a hard mask pattern over the epitaxial layer;

etching the epitaxial layer with the hard mask pattern as an etching mask to form a device isolation trench and a recess;

forming an oxide film layer for the filling the trench and the recess;

removing the hard mask pattern to perform an ion-implanting process on the active region;

removing the oxide film layer filled in the recess; and forming a gate over the recess.

2. The method according to claim 1, wherein the insulating film pattern is formed with one selected from an oxide film and a nitride film.

3. The method according to claim 1, wherein the insulating film pattern has a rectangular shape formed over the device isolation portion and both edges of the active region in a length direction.

4. The method according to claim 1, wherein the insulating film pattern has a rectangular shape formed over the device isolation portion and both edges of the active region in a length direction and along a gate direction.

5. The method according to claim 1, wherein the insulating film pattern is formed to have a thickness ranging from about 300 Å to about 500 Å.

6. The method according to claim 1, wherein the epitaxial layer is formed to have a thickness ranging from about 200 Å to about 300 Å.

7. The method according to claim 1, wherein the hard mask pattern has a deposition structure including an oxide film and a pad nitride film.

8. The method according to claim 1, wherein the device isolation trench and the recess are etched to have a depth ranging from about 1500 Å to about 2500 Å.

9. The method according to claim 1, wherein the device isolation trench in the epitaxial layer exposes a predetermined portion of the insulating film pattern.

10. The method according to claim 1, wherein the bottom of the recess is formed to be separated at a thickness ranging from about 100 Å to about 200 Å from the insulating film pattern.

11. The method according to claim 1, wherein the forming-an-oxide-film-layer step further comprises a CMP process.

12. The method according to claim 11, wherein the CMP process is performed until the thickness of the pad nitride film of the hard mask pattern remains ½ thereof.

13. The method according to claim 1, wherein the pad nitride film of the removing-the-hard-mask-pattern step is removed with hot $H_3PO_4$.

14. The method according to claim 1, wherein the impurities are implanted into a region between gates to form source/drain regions.

15. The method according to claim 13, wherein the oxide film layer of the removing-the-oxide-film-layer step is removed by a wet-etching process with a mask to expose the recess gate portion.

16. The method according to claim 1, wherein the recess in the epitaxial layer is formed between neighboring insulating film patterns.

* * * * *